(12) United States Patent
Akiyama

(10) Patent No.: US 10,038,864 B2
(45) Date of Patent: Jul. 31, 2018

(54) SOLID-STATE IMAGING DEVICE AND ELECTRONIC APPARATUS FOR PHASE DIFFERENCE AUTOFOCUSING

(71) Applicant: SONY CORPORATION, Tokyo (JP)

(72) Inventor: Hisashi Akiyama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/112,720

(22) PCT Filed: Jan. 16, 2015

(86) PCT No.: PCT/JP2015/051019
§ 371 (c)(1),
(2) Date: Jul. 20, 2016

(87) PCT Pub. No.: WO2015/115204
PCT Pub. Date: Aug. 6, 2015

(65) Prior Publication Data
US 2016/0337575 A1  Nov. 17, 2016

(30) Foreign Application Priority Data

Jan. 31, 2014  (JP) ................ 2014-016947

(51) Int. Cl.
H04N 5/369 (2011.01)
H04N 5/335 (2011.01)
(Continued)

(52) U.S. Cl.
CPC ....... H04N 5/3696 (2013.01); H04N 5/23212 (2013.01); H04N 5/335 (2013.01); H04N 9/045 (2013.01); G02B 5/201 (2013.01); G02B 7/34 (2013.01); H01L 27/14621 (2013.01); H01L 27/14623 (2013.01); H01L 27/14625 (2013.01);
(Continued)

(58) Field of Classification Search
None
See application file for complete search history.

(56) References Cited

U.S. PATENT DOCUMENTS

2009/0141027 A1* 6/2009 Sato ............... G01B 11/002
345/426
2009/0314928 A1* 12/2009 Parks .............. H01L 27/14629
250/208.1
(Continued)

FOREIGN PATENT DOCUMENTS

JP  2010-161256 A  7/2010
JP  2011-176715 A  9/2011
(Continued)

Primary Examiner — Justin P. Misleh
(74) Attorney, Agent, or Firm — Chip Law Group

(57) ABSTRACT

A solid-state imaging device including a phase difference pixel that includes a photoelectric conversion unit formed in a semiconductor substrate, a light blocking film that is provided in an insulating layer stacked on the semiconductor substrate, and shields substantially a half of the phase difference pixel from light, with the boundary being the pupil position, and a polarizing structure that polarizes light passing through an opening portion not shielded from light by the light blocking film. The present technology can be applied to solid-state imaging devices capable of image plane phase difference autofocusing, for example.

9 Claims, 6 Drawing Sheets

(51) Int. Cl.
*H04N 5/232* (2006.01)
*H04N 9/04* (2006.01)
*H01L 27/146* (2006.01)
*G02B 7/34* (2006.01)
*G02B 5/20* (2006.01)
*H04N 5/374* (2011.01)

(52) U.S. Cl.
CPC .. *H01L 27/14627* (2013.01); *H01L 27/14645* (2013.01); *H04N 5/374* (2013.01)

(56) References Cited

U.S. PATENT DOCUMENTS

| | | | |
|---|---|---|---|
| 2010/0194901 A1* | 8/2010 | van Hoorebeke | G02B 3/0068 348/218.1 |
| 2010/0253820 A1* | 10/2010 | Kanamori | H01L 27/14621 348/280 |
| 2010/0283883 A1* | 11/2010 | Sato | G02B 27/283 348/335 |
| 2010/0283885 A1* | 11/2010 | Lin | G02B 5/3025 348/340 |
| 2010/0303344 A1* | 12/2010 | Sato | H04N 9/045 382/162 |
| 2011/0279727 A1* | 11/2011 | Kusaka | H01L 27/14621 348/340 |
| 2011/0310280 A1* | 12/2011 | Goto | G02B 7/34 348/302 |
| 2012/0075513 A1* | 3/2012 | Chipman | G01J 4/04 348/302 |
| 2012/0168889 A1* | 7/2012 | Ooka | H01L 27/14625 257/432 |
| 2012/0287297 A1* | 11/2012 | Fukuda | G02B 5/3058 348/222.1 |
| 2012/0319222 A1* | 12/2012 | Ozawa | H01L 27/14605 257/432 |
| 2013/0002936 A1* | 1/2013 | Hirama | H04N 5/23212 348/349 |
| 2013/0010106 A1* | 1/2013 | Yokota | G01C 3/085 348/135 |
| 2013/0021521 A1* | 1/2013 | Hamada | H04N 5/23212 348/360 |
| 2015/0206912 A1* | 7/2015 | Kanamori | G02B 26/001 250/208.1 |

FOREIGN PATENT DOCUMENTS

| | | |
|---|---|---|
| JP | 2012-080065 A | 4/2012 |
| JP | 2012-212978 A | 11/2012 |

\* cited by examiner

SOLID-STATE IMAGING DEVICE AND ELECTRONIC APPARATUS FOR PHASE DIFFERENCE AUTOFOCUSING

CROSS REFERENCE TO RELATED APPLICATIONS

This application is a U.S. National Phase of International Patent Application No. PCT/JP2015/051019 filed on Jan. 16, 2015, which claims priority benefit of Japanese Patent Application No. 2014-016947 filed in the Japan Patent Office on Jan. 31, 2014. Each of the above-referenced applications is hereby incorporated herein by reference in its entirety.

TECHNICAL FIELD

The present disclosure relates to a solid-state imaging device and an electronic apparatus, and more particularly, to a solid-state imaging device and an electronic apparatus that enable acquisition of excellent phase difference properties in image plane phase difference autofocusing.

BACKGROUND ART

In recent years, imaging apparatuses capable of image plane phase difference autofocusing (AF) have been put into practical use. Such an imaging apparatus obtains two phase difference images with phase difference pixels provided in the imaging plane, and performs autofocusing by detecting the distance to the focus position in accordance with the difference in deviation between the two phase difference images.

For example, Patent Document 1 discloses an imaging device that includes opening masks provided for at least some of the photoelectric conversion elements in one-to-one correspondence, so as to output at least two parallax images.

CITATION LIST

Patent Document

Patent Document 1: Japanese Patent Application Laid-Open No. 2012-212978

SUMMARY OF THE INVENTION

Problems to be Solved by the Invention

In image plane phase difference AF, ideal phase difference properties can be achieved with a structure that completely splits the pupil at the phase difference pixels provided in the imaging plane. In a solid-state imaging device, however, it is difficult to form phase difference pixels in such a manner that the pupil splitting plane matches the photoelectric conversion area. Therefore, a distance is left between the pupil splitting plane and the photoelectric conversion area. Due to such a distance, light that has passed through the pupil splitting plane is diffracted, reflected, or absorbed. For this reason, it is difficult to achieve ideal phase difference properties in a conventional solid-state imaging device, and the phase difference properties deteriorate, resulting in lower autofocusing accuracy.

The present disclosure is made in view of those circumstances, and aims to enable acquisition of excellent phase difference properties in image plane phase difference autofocusing.

Solutions to Problems

A solid-state imaging device according to an aspect of the present disclosure includes a phase difference pixel that includes: a photoelectric conversion unit that is formed in a semiconductor substrate and performs photoelectric conversion; a light blocking film that is provided in an insulating layer stacked on the semiconductor substrate, and shields substantially a half of the phase difference pixel from light, with the boundary being the pupil position; and a polarizing structure that polarizes light passing through an opening portion not shielded from light by the light blocking film.

An electronic apparatus according to an aspect of the present disclosure includes a solid-state imaging device including a phase difference pixel that includes: a photoelectric conversion unit that is formed in a semiconductor substrate and performs photoelectric conversion; a light blocking film that is provided in an insulating layer stacked on the semiconductor substrate, and shields substantially a half of the phase difference pixel from light, with the boundary being the pupil position; and a polarizing structure that polarizes light passing through an opening portion not shielded from light by the light blocking film.

According to an aspect of the present disclosure, in a phase difference pixel, light passing through an opening portion not shielded by a light blocking film that is provided in an insulating layer stacked on a semiconductor substrate and shields substantially a half of the phase difference pixel, with the boundary being the pupil position, is polarized by a polarizing structure, and photoelectric conversion is performed at a photoelectric conversion unit formed in the semiconductor substrate.

Effects of the Invention

According to an aspect of the present disclosure, excellent phase difference properties can be achieved in image plane phase difference autofocusing.

MODES FOR CARRYING OUT THE INVENTION

The following is a detailed description of specific embodiments to which the present technology is applied, with reference to the drawings.

Figure 1:
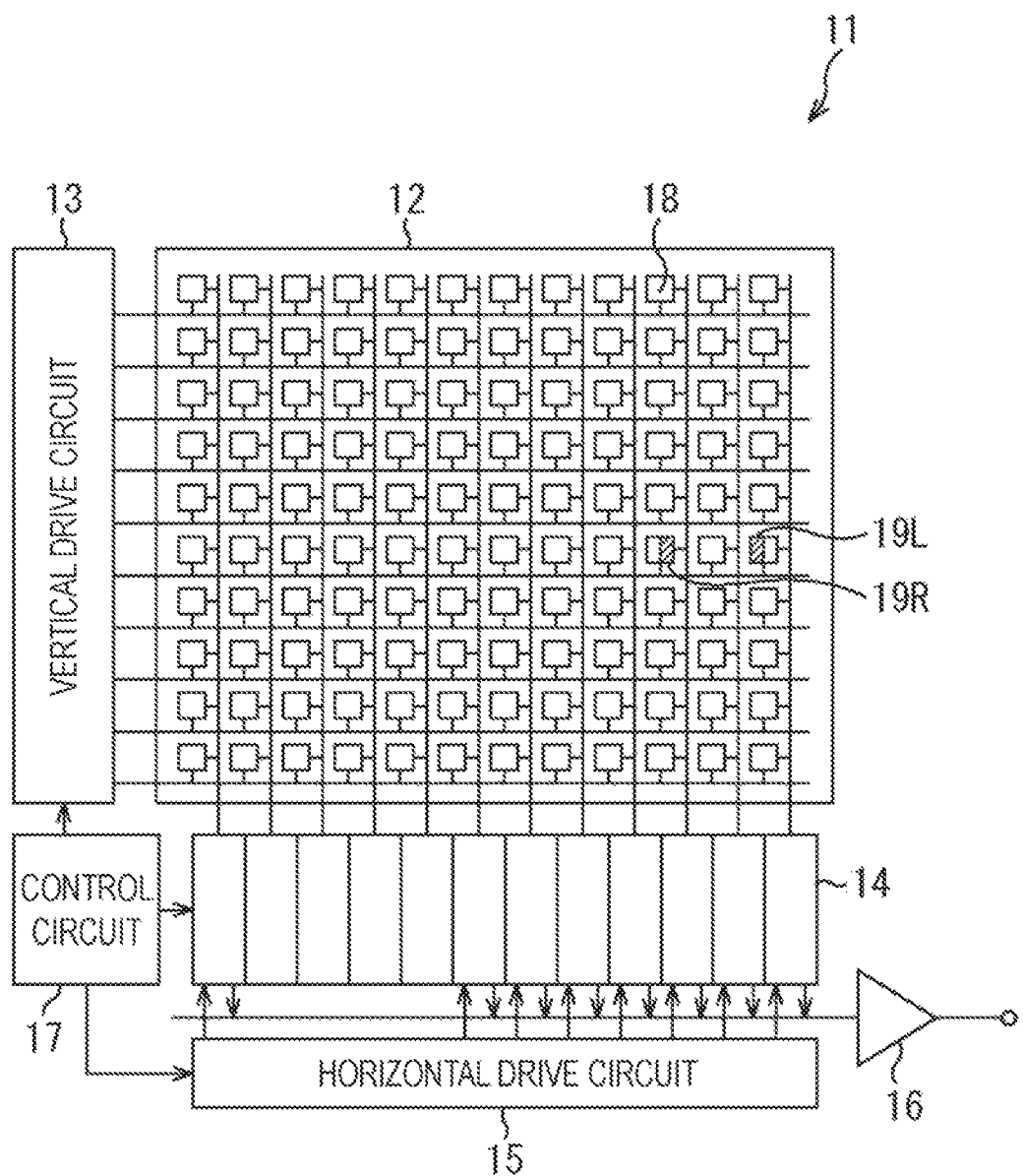
FIG. 1 is a block diagram showing an example structure of an embodiment of a solid-state imaging device to which the present technology is applied.

FIG. 1 is a block diagram showing an example structure of an embodiment of a solid-state imaging device to which the present technology is applied.

In FIG. 1, a solid-state imaging device 11 includes a pixel area 12, a vertical drive circuit 13, a column signal processing circuit 14, a horizontal drive circuit 15, an output circuit 16, and a control circuit 17.

In the pixel area 12, pixels 18 are arranged in a matrix fashion. Each of the pixels 18 is connected to the vertical drive circuit 13 via a horizontal signal line, and is also connected to the column signal processing circuit 14 via a vertical signal line. The pixels 18 each output a pixel signal in accordance with the amount of light emitted via an optical system (not shown), and an image of the object to be formed in the pixel area 12 is formed from these pixel signals.

For each row of the pixels 18 arranged in the pixel area 12, the vertical drive circuit 13 sequentially supplies drive signals for driving (or transferring signals to, selecting, resetting, or the like) the respective pixels 18, to the pixels 18 via the horizontal signal lines. The column signal processing circuit 14 conducts analog-digital conversion on an image signal and removes reset noise by performing Correlated Double Sampling (CDS) on the pixel signals output from the respective pixels 18 via the vertical signal lines.

For each row of the pixels 18 arranged in the pixel area 12, the horizontal drive circuit 15 sequentially supplies drive signals for outputting the pixel signals from the column signal processing circuit 14, to the column signal processing circuit 14. The output circuit 16 amplifies pixel signals supplied from the column signal processing circuit 14 at the times according to the drive signals from the horizontal drive circuit 15, and outputs the amplified pixel signals to an image processing circuit in a later stage.

The control circuit 17 controls driving of the respective blocks in the solid-state imaging device 11. For example, the control circuit 17 generates clock signals in accordance with the drive cycles of the respective blocks, and supplies the clock signals to the respective blocks.

To perform image plane phase difference AF in the solid-state imaging device 11 having the above structure, some of the regular pixels 18 to be used only for forming images are replaced with phase difference pixels 19 arranged at some locations for obtaining phase difference images in part of the pixel area 12.

FIG. 1 shows a pair of phase difference pixels 19L and 19R of the phase difference pixels 19 arranged at some locations. For example, a phase difference pixel 19R having its right half shielded from light, and a phase difference pixel 19L having its left half shielded from light are positioned, with one pixel 18 being interposed in between. The image plane phase difference AF is controlled in accordance with a difference in deviation between a phase difference image formed by phase difference pixels 19L arranged at locations in the pixel area 12, and a phase difference image formed by phase difference pixels 19R arranged at locations in the pixel area 12. Hereinafter, the phase difference pixels 19L and 19R will be referred to simply as the phase difference pixels 19 when there is no need to distinguish the phase difference pixels 19L and 19R from each other.

Figure 2:
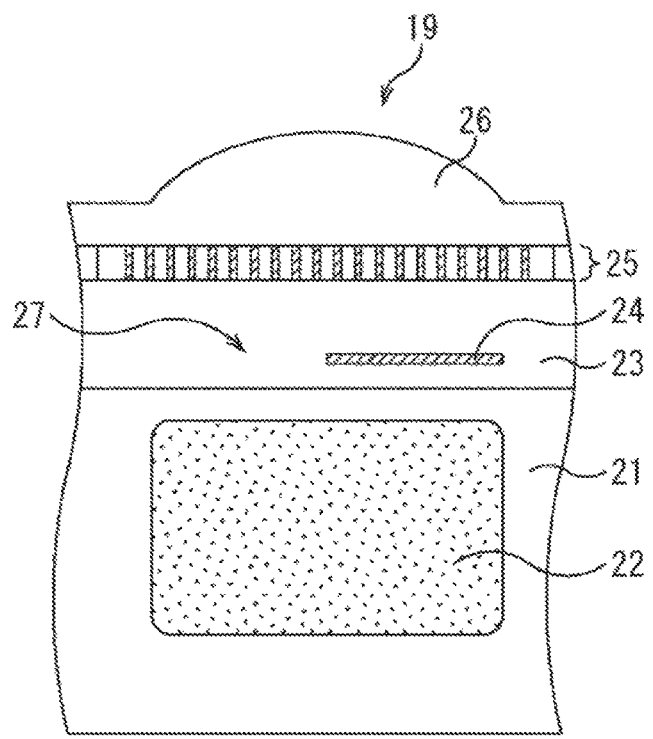
FIG. 2 is a cross-sectional diagram showing an example structure of a phase difference pixel.

FIG. 2 is a cross-sectional diagram showing an example structure of a phase difference pixel 19.

As shown in FIG. 2, the phase difference pixel 19 includes a photoelectric conversion unit 22 formed in a semiconductor substrate 21, a light blocking film 24 placed in an insulating layer 23 stacked on the semiconductor substrate 21, a polarizing structure 25 stacked on the insulating layer 23, and an on-chip lens 26 stacked on the polarizing structure 25.

The semiconductor substrate 21 is a thin silicon wafer formed by slicing high-purity single-crystal silicon. The photoelectric conversion unit 22 receives light that is emitted onto the phase difference pixel 19 and is not shielded by the light blocking film 24, and photoelectrically converts the light, to generate charge in accordance with the amount of the light. The insulating layer 23 insulates the light receiving surface side of the semiconductor substrate 21. The light blocking film 24 is formed with a metallic film having a light blocking effect, for example, and shields substantially a half of the phase difference pixel 19 from light, the boundary being the pupil position of the optical system gathering light onto the solid-state imaging device 11. In this manner, the phase difference pixel 19 performs pupil splitting.

The polarizing structure 25 polarizes light emitting onto the phase difference pixel 19. The regular pixels 18 other than the phase difference pixels 19 each have a color filter of one of the three primary colors, instead of the polarizing structure 25 of each phase difference pixel 19. Each pixel 18 receives light of each corresponding color. The on-chip lens 26 gathers light emitted onto the phase difference pixel 19.

The phase difference pixel 19 has the above described structure. Light emitted onto the phase difference pixel 19 is gathered by the on-chip lens 26, and is polarized in a predetermined polarization direction by the polarizing structure 25. While part of the polarized light is blocked by the light blocking film 24, the light that has passed through opening portions 27 that are not shielded by the light blocking film 24 from light is photoelectrically converted at the photoelectric conversion unit 22.

Figure 3:
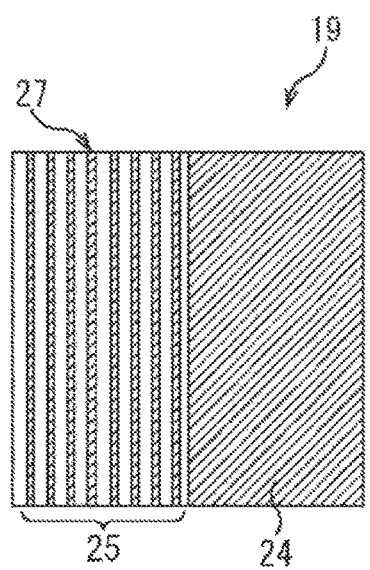
FIG. 3 is a diagram for explaining a direction of polarization to be caused by a polarizing structure.

Referring now to FIG. 3, the direction of polarization to be caused by the polarizing structure 25 is described. FIG. 3 shows the light blocking film 24 and the polarizing structure 25 in a plan view of the phase difference pixel 19.

The phase difference pixel 19 shown in FIG. 3 has substantially a square shape in the plan view. The light blocking film 24 is provided in the right half, and the opening portions 27 are formed in the left half of the phase difference pixel 19. In this structure, the opening portions 27 each have a rectangular shape, with the longitudinal direction being the vertical direction in FIG. 3.

The polarizing structure 25 is formed by placing metal wires parallel to one another at predetermined intervals. In the example shown in FIG. 3, the metal wires constituting the polarizing structure 25 extend in the longitudinal direction of the opening portions 27. With this, light emitted onto the phase difference pixel 19 is polarized in a direction parallel to the longitudinal direction of the opening portions 27 by the polarizing structure 25. That is, the polarization direction of the polarizing structure 25 of the phase difference pixel 19 shown in FIG. 3 is the longitudinal direction of the opening portions 27.

In this structure, light emitted onto the phase difference pixel 19 is diffracted or reflected while passing through the opening portions 27 before reaching the photoelectric conversion unit 22, and leak out of the phase difference pixel 19. This results in degradation of the phase difference properties of the image plane phase difference AF. In general, light in a uniform polarization direction is characteristically restricted from leaking in a direction perpendicular to the polarization direction. Using such characteristics related to polarization, the solid-state imaging device 11 can reduce degradation of phase difference properties. Specifically, the polarization direction is set in such a direction that light oscillation becomes smaller toward (or perpendicular to) the adjacent pixels 18 to be actively protected from light leakage. In this manner, light is prevented from entering the adjacent pixels 18, and light leakage can be reduced.

The polarizing structure 25 for polarizing light in the phase difference pixel 19 may be a structure having a wire grid or a structure having a polarizing sheet.

Each phase difference pixel 19 in which the polarizing structure 25 is placed to polarize light in the longitudinal direction of the opening portions 27 as shown in FIG. 3 will be hereinafter referred to as a first phase difference pixel 19-1. Meanwhile, each phase difference pixel 19 in which the polarizing structure 25 is placed to polarize light in a direction perpendicular to the longitudinal direction of the opening portions 27 will be hereinafter referred to as a second phase difference pixel 19-2.

Figure 4:
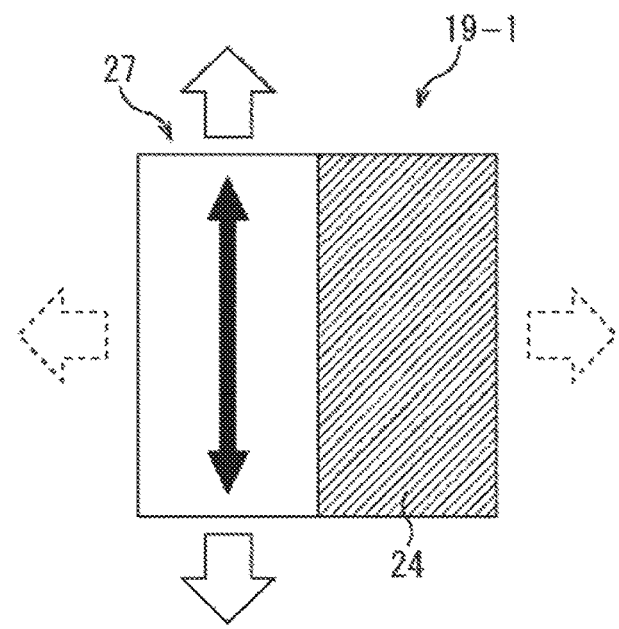
FIG. 4 is a diagram for explaining the relationship between polarization directions and light leakage.
Figure 5:
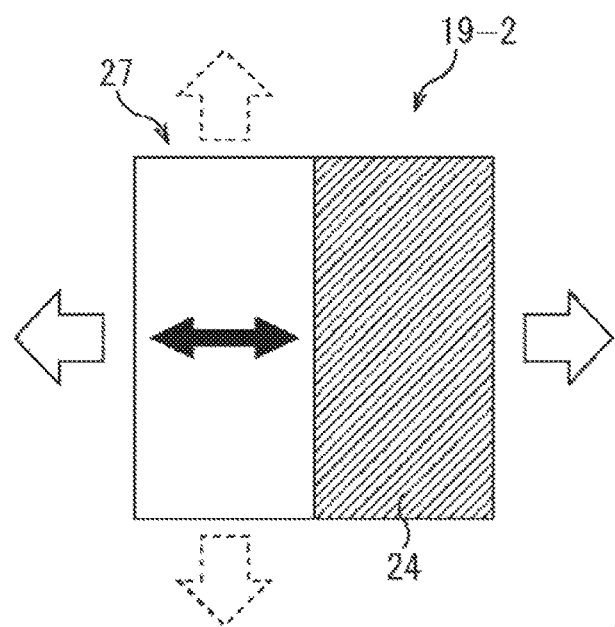
FIG. 5 is a diagram for explaining the relationship between polarization directions and light leakage.

FIG. 4 shows an example of the relationship between the polarization direction in a first phase difference pixel 19-1 and light leakage. FIG. 5 shows an example of the relationship between the polarization direction in a second phase difference pixel 19-2 and light leakage.

In FIG. 4, the polarization direction in the first phase difference pixel 19-1 is indicated by solid black arrows. Because of the above described polarization properties, light that has passed through the opening portions 27 is restricted from leaking in the direction indicated by white arrows drawn with dashed lines (the horizontal direction in the drawing), as opposed to light leakage in the direction that is parallel to the polarization direction and is indicated by white arrows drawn with solid lines (the vertical direction in the drawing).

Likewise, in the second phase difference pixel 19-2 in FIG. 5, the direction of polarization to be caused by the polarizing structure 25 is perpendicular to the longitudinal direction of the opening portions 27, as indicated by solid black arrows. Because of the above described polarization properties, light that has passed through the opening portions 27 is restricted from leaking in the direction indicated by white arrows drawn with dashed lines (the vertical direction in the drawing), as opposed to light leakage in the direction that is parallel to the polarization direction and is indicated by white arrows drawn with solid lines (the horizontal direction in the drawing).

In the solid-state imaging device 11, an appropriate polarization direction can be set on light passing through the opening portions 27 by the polarizing structure 25 in the above described manner, so that light leakage can be reduced or prevented. Consequently, influence of light diffraction or reflection due to the distance between the photoelectric conversion unit 22 and the opening portions 27 can be reduced in the solid-state imaging device 11. Thus, the solid-state imaging device 11 can increase demosaicing accuracy, and avoid wrongly regarding each pixel 18 adjacent to the light leakage restriction side as a defective pixel.

In the solid-state imaging device 11, any distance may be set between the light blocking film 24 and the photoelectric conversion unit 22, as long as the light blocking film 24 is located in a higher position than the photoelectric conversion unit 22. However, the light blocking film 24 is preferably located closer to the photoelectric conversion unit 22.

In the solid-state imaging device 11, the polarization direction may be set in any direction as in the first phase difference pixel 19-1 and the second phase difference pixel 19-2. However, the phase difference properties can be improved by providing phase difference pixels 19 in which at least one direction is set as a polarization direction.

In the solid-state imaging device 11, phase difference pixels 19 may also be arranged in an invalid area provided near the outer periphery of the pixel area 12.

Figure 6:
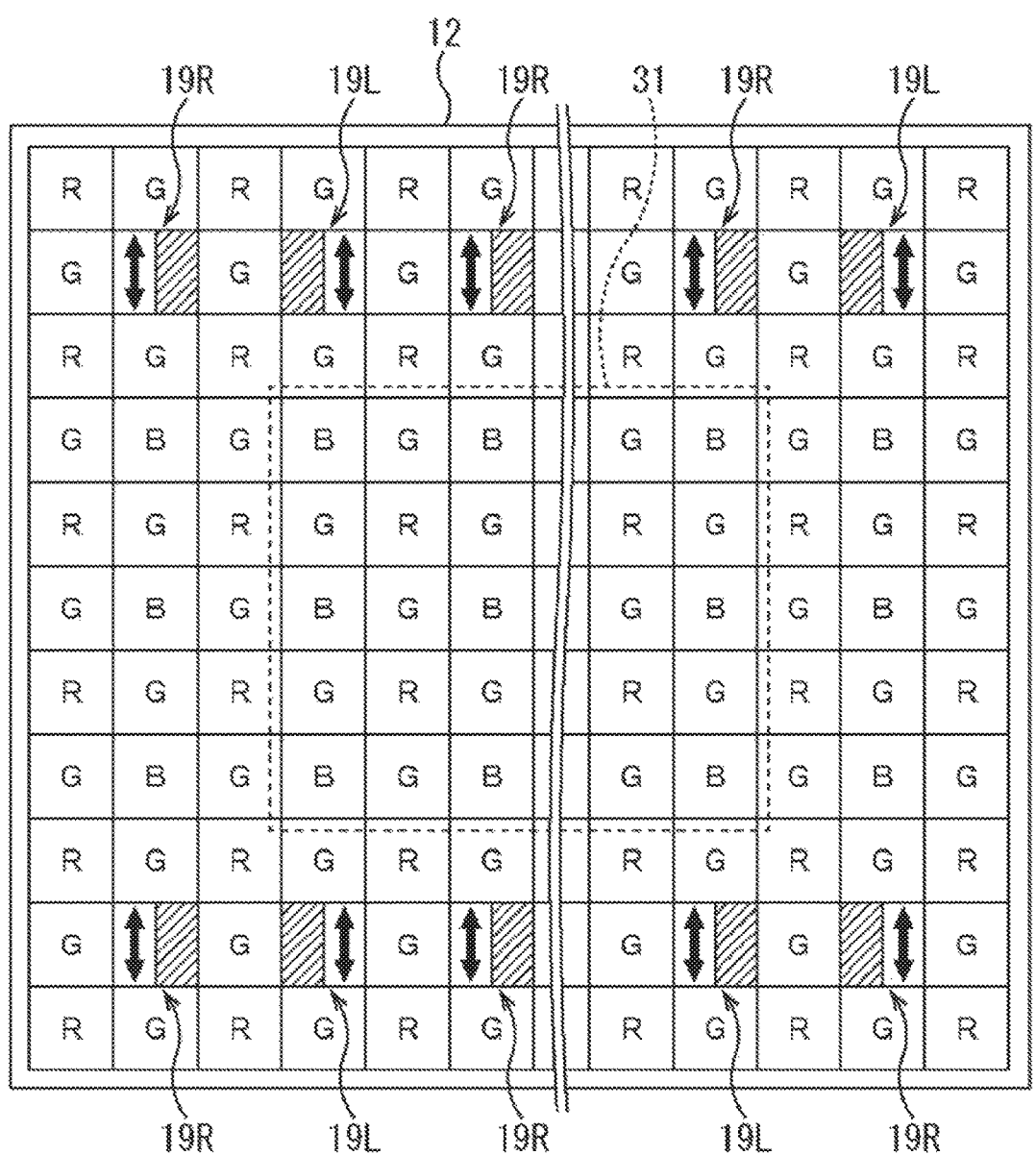
FIG. 6 is a diagram showing the phase difference pixels arranged in an invalid area.

Specifically, as shown in FIG. 6, the pixel area 12 has a valid area 31 at its center, and the invalid area outside the valid area 31. The pixels 18 to be used in forming an image are arranged in the valid area 31. In this invalid area, pairs of phase difference pixels 19L and 19R can be arranged every other pixel in a line at each of upper and lower portions of the pixel area 12, for example.

FIG. 6 shows an example structure in which the phase difference pixels 19L and 19R are arranged in the positions corresponding to the positions where blue color filters are placed among the pixels 18 arranged in the valid area 31. Alternatively, the phase difference pixels 19L and 19R may be arranged in the positions where green or red color filters are placed, for example.

Figure 7:
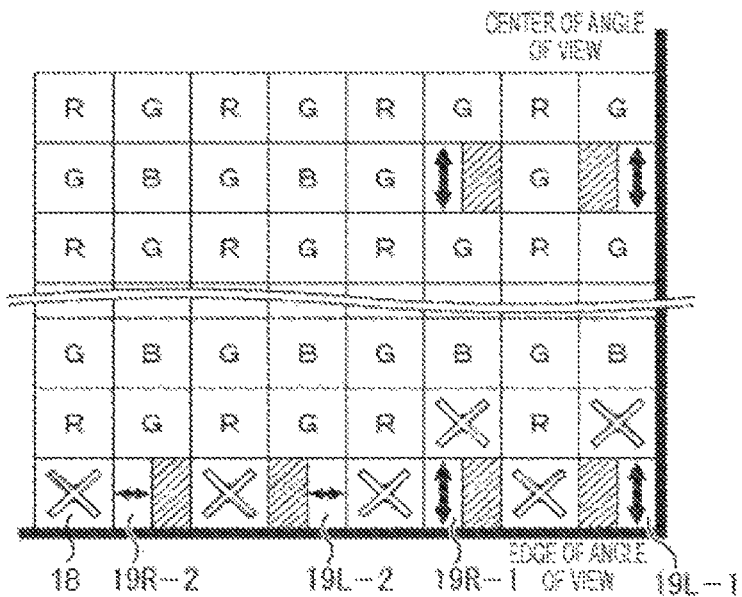
FIG. 7 is a diagram for explaining pixels to be regarded defective.
Figure 8:
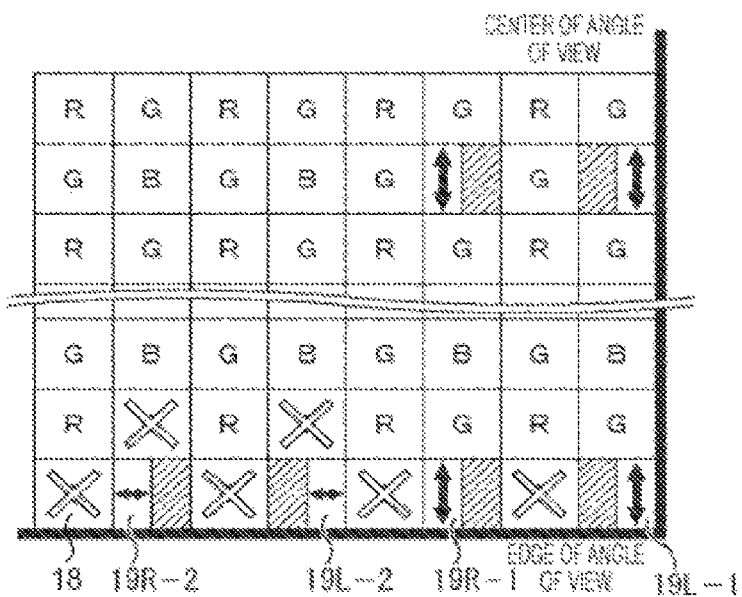
FIG. 8 is a diagram for explaining pixels to be regarded defective.

Referring now to FIGS. 7 and 8, pixels 18 to be regarded as defective are described. In FIG. 7, cross marks indicate the pixels 18 to be regarded as defective when imaging is performed indoors. In FIG. 8, cross marks indicate the pixels 18 to be regarded as defective when imaging is performed outdoors.

As shown in FIGS. 7 and 8, first phase difference pixels 19-1 or second phase difference pixels 19-2 can be selectively placed in the direction in which light leakage is to be reduced. For example, near the center of the angle of view, first phase difference pixels 19-1 are placed to prevent the pixels 18 adjacent thereto in the transverse direction from being regarded as defective. Near an edge of the angle of view, on the other hand, second phase difference pixels 19-2 are placed to prevent the pixels 18 adjacent thereto in the vertical direction from being regarded as defective and increase accuracy, while any measures are not taken to prevent the pixels 18 adjacent to phase difference pixels 19 in the transverse direction from being regarded as defective.

Since light is in a non-polarized state indoors, a pair of first phase difference pixels 19L-1 and 19R-1 are selected indoors. Since light is likely to be vertically polarized outdoors, a pair of second phase difference pixels 19L-2 and 19R-2 are selected outdoors. As the phase difference pixels 19 are arranged at a higher density at the periphery of the pixel area 12 in the solid-state imaging device 11 as described above, phase difference pixels 19 having the polarization direction to be used in phase difference detection can be selectively used.

In the solid-state imaging device 11 having the above described structure, the signals to be output from the phase difference pixels 19 have sharper peaks, regardless of polarization directions. With this, the focusing accuracy by virtue of the image plane phase difference AF can be increased. Thus, use in combination with contrast AF can be avoided, for example, and focusing can be performed at higher speed.

In a solid-state imaging device having phase difference pixels that do not perform polarization with polarizing structures 25, there coexist light beams having various polarization directions, and random reflectivities are obtained. As a result, the light intensity is averaged in general, and it is difficult to detect the peaks of signals that are output from the phase difference pixels.

In the solid-state imaging device 11, on the other hand, the phase difference pixels 19 have uniform polarization direction, and there is a large difference between the maximum value and the minimum value of the signals to be output from the phase difference pixels 19. With such a large difference, there is no need to apply a gain to amplify the difference. Thus, the solid-state imaging device 11 can achieve higher phase difference properties than those of a structure that applies such a gain.

The solid-state imaging device 11 of this embodiment can be applied to both a Charge Coupled Device (CCD) and a Complementary Metal Oxide Semiconductor (CMOS). The solid-state imaging device 11 of this embodiment can be applied both to a surface-illuminated CMOS image sensor in which light is emitted onto the semiconductor substrate from the front surface on which an interconnect layer is stacked, and to a back-illuminated CMOS image sensor in which light is emitted onto the back surface located on the opposite side from the front surface. Further, the solid-state imaging device 11 of this embodiment can also be applied to a CMOS image sensor having a global shutter function to read charge almost simultaneously from the photoelectric conversion units of the pixels 18 arranged in the pixel area 12.

The solid-state imaging device 11 of each of the above described embodiments can be used in various kinds of electronic apparatuses, such as imaging systems for digital still cameras and digital video cameras, portable telephone devices having imaging functions, and other apparatuses having imaging functions.

Figure 9:
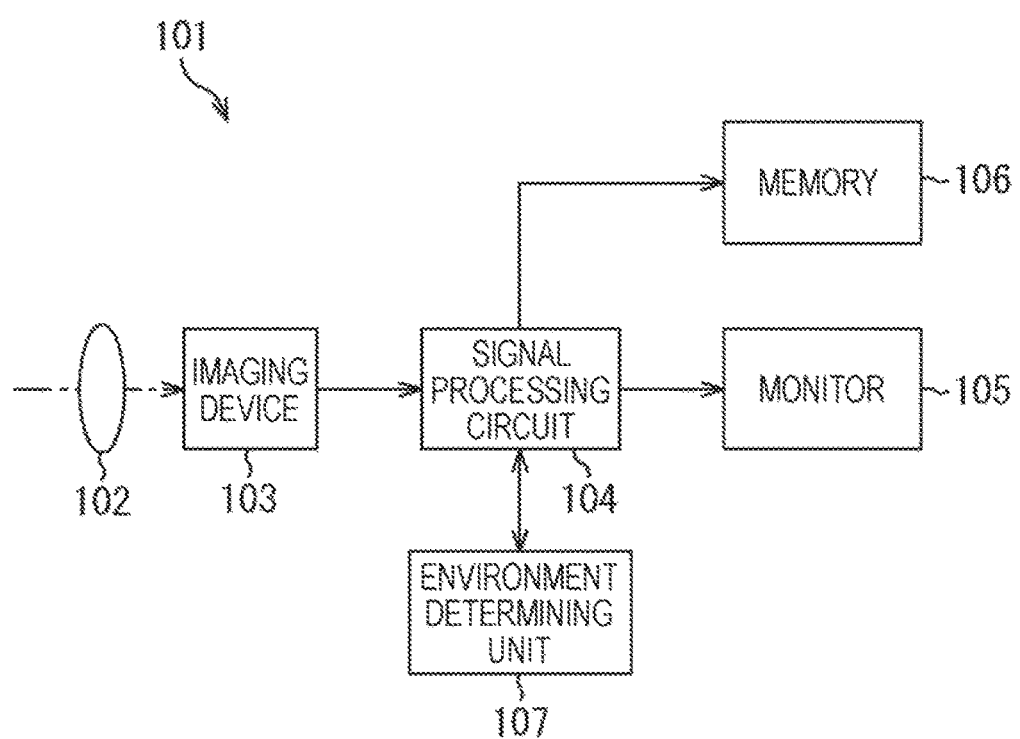
FIG. 9 is a block diagram showing an example structure of an electronic apparatus.

FIG. 9 is a block diagram showing an example structure of an imaging apparatus installed in an electronic apparatus.

As shown in FIG. 9, an imaging apparatus 101 includes an optical system 102, an imaging device 103, a signal processing circuit 104, a monitor 105, a memory 106, and an environment determining unit 107, and can take still images and moving images.

The optical system 102 includes one or more lenses to guide light (incident light) from an object to the imaging device 103, and form an image on the light receiving surface (the sensor portion) of the imaging device 103.

The solid-state imaging device 11 of the above described embodiment is used as the imaging device 103. In the imaging device 103, electrons are accumulated for a certain period of time in accordance with an image to be formed on the light receiving surface via the optical system 102. A signal in accordance with the electrons accumulated in the imaging device 103 is then supplied to the signal processing circuit 104.

The signal processing circuit 104 performs various kinds of signal processing on pixel signals that are output from the imaging device 103. The image (image data) obtained through the signal processing performed by the signal processing circuit 104 is supplied to and displayed on the monitor 105, or is supplied to and stored (recorded) into the memory 106. The signal processing circuit 104 can also perform an autofocusing process by controlling the optical system 102 in accordance with a phase difference image formed by the phase difference pixels 19 of the imaging device 103.

The environment determining unit 107 analyzes an image output from the signal processing circuit 104, and determines the external environment of the imaging apparatus 101, such as whether imaging is being performed indoor or whether imaging is being performed outdoors. The environment determining unit 107 then notifies the signal processing circuit 104 of a determination result indicating that the external environment of the imaging apparatus 101 is indoors or outdoors. In accordance with the determination result, the signal processing circuit 104 can appropriately select the phase difference pixels 19 to be used for the image plane phase difference AF.

In the imaging apparatus 101 having such a structure, the solid-state imaging device 11 of the above described embodiment is used, to achieve excellent phase difference properties. Consequently, autofocusing accuracy can be increased.

The present technology can also be in the following forms.

(1) A solid-state imaging device including a phase difference pixel including:

a photoelectric conversion unit that is formed in a semiconductor substrate and performs photoelectric conversion;

a light blocking film that is provided in an insulating layer stacked on the semiconductor substrate, and shields substantially a half of the phase difference pixel from light, with the boundary being the pupil position; and a polarizing structure that polarizes light passing through an opening portion not shielded from light by the light blocking film.

(2) The solid-state imaging device of (1), wherein the polarizing structure polarizes light in a direction parallel to the longitudinal direction of the opening portion.

(3) The solid-state imaging device of (1), wherein the polarizing structure polarizes light in a direction perpendicular to the longitudinal direction of the opening portion.

(4) The solid-state imaging device of any of (1) through (3), wherein the phase difference pixel is provided in an invalid area formed near the outer periphery of a valid area in a pixel area in which a plurality of pixels are arranged in a matrix fashion, the pixels to be used in forming an image being arranged in the center portion of the pixel area.

(5) The solid-state imaging device of (4), wherein a phase difference pixel having a polarizing structure that polarizes light in a direction not toward the valid area is provided at the center of the angle of view.

(6) The solid-state imaging device of any of (1) through (5), wherein a pair of a first phase difference pixel and a second phase difference pixel are provided near an edge of the angle of view, the first phase difference pixel polarizing light in a predetermined direction, the second phase difference pixel polarizing light in a direction perpendicular to the predetermined direction.

(7) The solid-state imaging device of any of (1) through (6), wherein the phase difference pixel is provided in a position where a green color filter is placed among the pixels to be used in forming an image.

(8) The solid-state imaging device of any of (1) through (6), wherein the phase difference pixel is provided in a position where a red color filter is placed among the pixels to be used in forming an image.

(9) The solid-state imaging device of any of (1) through (6), wherein the phase difference pixel is provided in a position where a blue color filter is placed among the pixels to be used in forming an image.

(10) An electronic apparatus including a solid-state imaging device including a phase difference pixel including:

a photoelectric conversion unit that is formed in a semiconductor substrate and performs photoelectric conversion;

a light blocking film that is provided in an insulating layer stacked on the semiconductor substrate, and shields substantially a half of the phase difference pixel from light, with the boundary being the pupil position; and a polarizing structure that polarizes light passing through an opening portion not shielded from light by the light blocking film.

(11) The electronic apparatus of (10), further including a signal processing unit that performs a focusing process in accordance with a phase difference image formed by the phase difference pixel included in the solid-state imaging device.

(12) The electronic apparatus of (10) or (11), wherein:
a first phase difference pixel that polarizes light in a predetermined direction is provided;
a second phase difference pixel that polarizes light in a direction perpendicular to the predetermined direction is provided; and
the signal processing unit selectively uses a signal output from the first phase difference pixel when imaging is performed indoors, and selectively uses a signal output from the first phase difference pixel when imaging is performed outdoors.

(13) The electronic apparatus of any of (10) through (12), wherein the polarizing structure polarizes light in a direction parallel to the longitudinal direction of the opening portion.

(14) The electronic apparatus of any of (10) through (12), wherein the polarizing structure polarizes light in a direction perpendicular to the longitudinal direction of the opening portion.

(15) The electronic apparatus of any of (10) through (14), wherein the phase difference pixel is provided in an invalid area formed near the outer periphery of a valid area in a pixel area in which a plurality of pixels are arranged in a matrix fashion, the pixels to be used in forming an image being arranged in the center portion of the pixel area.

(16) The electronic apparatus of (15), wherein a phase difference pixel having a polarizing structure that polarizes light in a direction not toward the valid area is provided at the center of the angle of view.

(17) The electronic apparatus of any of (10) through (16), wherein a pair of a first phase difference pixel and a second phase difference pixel are provided near an edge of the angle of view, the first phase difference pixel polarizing light in a predetermined direction, the second phase difference pixel polarizing light in a direction perpendicular to the predetermined direction.

(18) The electronic apparatus of any of (10) through (17), wherein the phase difference pixel is provided in a position where a green color filter is placed among the pixels to be used in forming an image.

(19) The electronic apparatus of any of (10) through (17), wherein the phase difference pixel is provided in a position where a red color filter is placed among the pixels to be used in forming an image.

(20) The electronic apparatus of any of (10) through (17), wherein the phase difference pixel is provided in a position where a blue color filter is placed among the pixels to be used in forming an image.

It should be noted that this embodiment is not limited to the above described embodiments, and various modifications may be made to them without departing from the scope of the present disclosure.

REFERENCE SIGNS LIST

11 Solid-state imaging device
12 Pixel area
13 Vertical drive circuit
14 Column signal processing circuit
15 Horizontal drive circuit
16 Output circuit
17 Control circuit
18 Pixel
19 Phase difference pixel
21 Semiconductor substrate
22 Photoelectric conversion unit
23 Insulating layer
24 Light blocking film
25 Polarizing structure
26 On-chip lens
27 Opening portion
101 Imaging apparatus
102 Optical system
103 Imaging device
104 Signal processing circuit
105 Monitor
106 Memory
107 Environment determining unit

The invention claimed is:

1. An electronic apparatus, comprising:
a solid-state imaging device that includes a first phase difference pixel and a second phase difference pixel, wherein each of the first phase difference pixel and the second phase difference pixel includes:
a photoelectric conversion unit configured to execute photoelectric conversion, wherein the photoelectric conversion unit is in a semiconductor substrate;
a light blocking film configured to shield substantially a half of a respective phase difference pixel of the first phase difference pixel and the second phase difference pixel from light, with a boundary at a pupil position, wherein the light blocking film is in an insulating layer stacked on the semiconductor substrate; and
a polarizing structure configured to polarize light that passes through an opening portion not shielded from light by the light blocking film,
wherein the first phase difference pixel is configured to polarize the light in a first direction and the second phase difference pixel is configured to polarize the light in a second direction perpendicular to the first direction; and
a signal processing circuit configured to execute a focusing process based on a phase difference image generated by one of the first phase difference pixel or the second phase difference pixel, wherein the signal processing circuit selectively uses a first signal output from the first phase difference pixel based on imaging in an indoor environment, and selectively uses a second signal output from the second phase difference pixel based on imaging in an outdoor environment.

2. The electronic apparatus according to claim 1, wherein the polarizing structure is further configured to polarize the light in a direction parallel to a longitudinal direction of the opening portion.

3. The electronic apparatus according to claim 1, wherein the polarizing structure is further configured to polarize the light in a direction perpendicular to a longitudinal direction of the opening portion.

4. The electronic apparatus according to claim 1, wherein one of the first phase difference pixel or the second phase difference pixel is in a first area near an outer periphery of a second area in a pixel area, wherein the pixel area includes a plurality of pixels arranged in a matrix, wherein the plurality of pixels are configured to generate an image arranged in a center portion of the pixel area.

5. The electronic apparatus according to claim 4, wherein one of the first phase difference pixel or the second phase difference pixel having the polarizing structure is at a center of an angle of view, wherein the polarizing structure is further configured to polarize the light in a direction away from the second area.

6. The electronic apparatus according to claim 5, wherein the first phase difference pixel and the second phase difference pixel are near an edge of the angle of view.

7. The electronic apparatus according to claim 1, wherein the first phase difference pixel and the second phase difference pixel are in a position where a green color filter is placed among a plurality of pixels used to generate an image.

8. The electronic apparatus according to claim 1, wherein the first phase difference pixel and the second phase difference pixel are in a position where a red color filter is placed among a plurality of pixels used to generate an image.

9. The electronic apparatus according to claim 1, wherein the first phase difference pixel and the second phase difference pixel are in a position where a blue color filter is placed among a plurality of pixels used to generate an image.

* * * * *